(12) United States Patent
Pao et al.

(10) Patent No.: US 11,283,240 B2
(45) Date of Patent: Mar. 22, 2022

(54) PILLAR CONFINED BACKSIDE EMITTING VCSEL

(71) Applicant: OEpic SEMICONDUCTORS, INC, Sunnyvale, CA (US)

(72) Inventors: Yi-Ching Pao, Sunnyvale, CA (US); Majid Riaziat, Sunnyvale, CA (US); Ta-Chung Wu, Sunnyvale, CA (US); Wilson Kyi, Sunnyvale, CA (US); James Pao, Sunnyvale, CA (US)

(73) Assignee: OEPIC SEMICONDUCTORS, INC., Sunnyvale, CA (US)

( * ) Notice: Subject to any disclaimer, the term of this patent is extended or adjusted under 35 U.S.C. 154(b) by 0 days.

(21) Appl. No.: 16/208,958

(22) Filed: Dec. 4, 2018

(65) Prior Publication Data
US 2019/0214787 A1    Jul. 11, 2019

Related U.S. Application Data

(60) Provisional application No. 62/615,069, filed on Jan. 9, 2018.

(51) Int. Cl.
| | |
|---|---|
| *H01S 5/183* | (2006.01) |
| *H01S 5/026* | (2006.01) |
| *H01S 5/0234* | (2021.01) |
| *H01S 5/0237* | (2021.01) |
| *H01S 5/34* | (2006.01) |

(Continued)

(52) U.S. Cl.
CPC .......... *H01S 5/18305* (2013.01); *H01S 5/026* (2013.01); *H01S 5/0234* (2021.01); *H01S 5/0237* (2021.01); *H01S 5/18347* (2013.01); *H01S 5/0207* (2013.01); *H01S 5/02469* (2013.01); *H01S 5/04256* (2019.08); *H01S 5/18394* (2013.01); *H01S 5/2081* (2013.01);
(Continued)

(58) Field of Classification Search
CPC ............... H01S 5/18305; H01S 5/0224; H01S 5/18347; H01S 5/423; H01S 5/04256; H01S 5/18344–18352
See application file for complete search history.

(56) References Cited

U.S. PATENT DOCUMENTS 5,034,344 A  *  7/1991  Jewell .................... B82Y 20/00
                                                            438/34
5,073,041 A  *  12/1991  Rastani ................... H01S 5/423
                                                            372/101
(Continued)

FOREIGN PATENT DOCUMENTS

JP          04252090 A  *  9/1992
JP          07038196 A  *  2/1995

*Primary Examiner* — Joshua King
(74) *Attorney, Agent, or Firm* — Weiss & Moy, P.C.; Jeffrey D. Moy

(57) ABSTRACT

A backside Vertical Cavity Surface Emitting Laser (VCSEL) has a substrate. A first mirror device is formed on the substrate. An active region is formed on the first mirror device. A second mirror device is formed on the active region. A pillar is formed by directional Inductive Coupled Plasma-Reactive Ion Etcher (ICP-RIE). The pillar exposes a portion of the first mirror device, the active region and the second mirror device. A first metal contact is formed over a top section of the pillar. A second metal contact is formed on the substrate. An opening formed in the second metal contact and aligned with the pillar.

14 Claims, 4 Drawing Sheets

(51) Int. Cl.
*H01S 5/02* (2006.01)
*H01S 5/20* (2006.01)
*H01S 5/042* (2006.01)
*H01S 5/42* (2006.01)
*H01S 5/024* (2006.01)

(52) U.S. Cl.
CPC ............... *H01S 5/34* (2013.01); *H01S 5/423* (2013.01); *H01S 2304/04* (2013.01)

(56) References Cited

U.S. PATENT DOCUMENTS

| | | | | |
|---|---|---|---|---|
| 5,216,263 A | * | 6/1993 | Paoli | B41J 2/45 257/88 |
| 5,256,596 A | * | 10/1993 | Ackley | H01S 5/18308 372/45.01 |
| 5,258,316 A | * | 11/1993 | Ackley | H01S 5/18327 372/45.01 |
| 5,258,990 A | * | 11/1993 | Olbright | B82Y 20/00 372/50.11 |
| 5,295,147 A | * | 3/1994 | Jewell | H01S 5/18358 372/45.01 |
| 5,883,914 A | * | 3/1999 | Kinoshita | B82Y 20/00 372/50.1 |
| 6,005,262 A | | 12/1999 | Cunningham et al. | |
| 6,888,871 B1 | * | 5/2005 | Zhang | H01S 5/423 372/36 |
| 7,257,141 B2 | * | 8/2007 | Chua | H01S 5/423 372/46.013 |
| 8,995,485 B2 | * | 3/2015 | Joseph | H01S 5/04257 372/36 |
| 8,995,493 B2 | * | 3/2015 | Joseph | H01S 5/183 372/50.12 |
| 2003/0053510 A1 | | 3/2003 | Yuen et al. | |
| 2004/0042523 A1 | * | 3/2004 | Albrecht | H01S 5/041 372/70 |
| 2007/0091961 A1 | * | 4/2007 | Lin | H01S 5/18313 372/50.124 |
| 2008/0054291 A1 | * | 3/2008 | Kim | B82Y 20/00 257/103 |
| 2008/0254566 A1 | * | 10/2008 | Yokouchi | B82Y 20/00 438/93 |
| 2010/0103972 A1 | * | 4/2010 | Saito | H01S 5/0425 372/50.1 |
| 2010/0303113 A1 | * | 12/2010 | Joseph | H01S 5/423 372/36 |
| 2012/0051685 A1 | | 3/2012 | Su et al. | |
| 2015/0063387 A1 | * | 3/2015 | Joseph | H01S 5/02438 372/36 |
| 2015/0255955 A1 | * | 9/2015 | Wang | H01S 5/18311 438/29 |
| 2017/0033535 A1 | * | 2/2017 | Joseph | H01S 5/18308 |

* cited by examiner

PILLAR CONFINED BACKSIDE EMITTING VCSEL

This patent application is related to U.S. Provisional Application No. 62/615,069 filed Jan. 9, 2018, entitled "PILLAR CONFINED BACKSIDE ILLUMINATING VCSEL FOR 3D SENSING ARRAY" in the names of Yi-Ching Pao, Majid Riaziat, Ta-Chung Wu, Wilson Kyi and James Pao, and which is incorporated herein by reference in its entirety. The present patent application claims the benefit under 35 U.S.C. § 119(e).

TECHNICAL FIELD

The present invention generally relates to vertical cavity surface emitting lasers (VCSELs) and, more particularly to, a VCSEL and a method of making the same which allows the VCSEL array to be packed in a denser way, thereby increasing the die counts formed on a wafer and reducing the die cost accordingly.

BACKGROUND

Semiconductor lasers are being used in many imaging applications which require high power illumination such as structured light sources for 3D imaging, Laser Detection and Ranging (LADAR), Time of Flight (TOF) 3D imaging, aviation defense, and fusion research, among others. Vertical Cavity Surface Emitting Lasers (VCSELs), are commonly used in many semiconductor laser applications due to the low power applications and high frequency superiority and manufacturing advantages over other type of semiconductor laser devices.

A VCSEL is a semiconductor micro-laser diode that emits light in a generally cylindrical beam. The beam is emitted vertically from the surface of the substrate on which it is fabricated. Because the beams in VCSELs emit vertically from the surface of the substrate, they can be tested on-wafer, before they are separated into individual devices. This reduces the fabrication cost of the devices. It also allows VCSELs to be built not only in one-dimensional, but also in two-dimensional arrays.

VCSELs generally have larger output apertures compared to most edge-emitting lasers. This may allow VCSELs to produce a lower divergence angle of the output beam, and makes possible high coupling efficiency with optical fibers. VCSELs also have high reflectivity mirrors, compared to most edge-emitting lasers, which may reduce the threshold current of VCSELs, resulting in low power consumption. The low threshold current also permits high intrinsic modulation bandwidths in VCSELs. The wavelength of VCSELs may also be tuned, within the gain band of the active region, by adjusting the thickness of the reflector layers.

In one type of VCSEL structure, a mesa/pillar type structure is formed with a relatively small oxidation aperture area, which enables it for high speed operations. Unfortunately, due to the structure of the required oxide layers, it is difficult to reduce the size of the VCSEL mesa. This limits the size/density of a VCSEL array, which limits the number of VCSEL devices that may be made on a single wafer, and thus increases die cost.

Therefore, it would be desirable to provide a homeopathic treatment and method that overcome the above problems.

SUMMARY

In accordance with one embodiment, a backside Vertical Cavity Surface Emitting Laser (VCSEL) is disclosed. The VCSEL has a substrate. A first mirror device is formed on the substrate. An active region is formed on the first mirror device. A second mirror device is formed on the active region. A pillar is formed by directional Inductive Coupled Plasma-Reactive Ion Etcher (ICP-RIE). The pillar exposes a portion of the first mirror device, the active region and the second mirror device. A first metal contact is formed over a top section of the pillar. A second metal contact is formed on the substrate. An opening is formed in the second metal contact and aligned with the pillar.

In accordance with one embodiment, a method of forming a backside Vertical Cavity Surface Emitting Laser (VCSEL) device is disclosed. The method comprises: forming a first mirror device on a substrate; forming an active region on the first mirror device; forming a second mirror device on the active region; forming a pillar by directional Inductive Coupled Plasma-Reactive Ion Etcher (ICP-RIE), the pillar exposing a portion of the first mirror device, the active region and the second mirror device; applying a first metal contact over a top section of the pillar, and applying a second metal contact on the substrate, wherein an opening is formed in the second metal contact, and the opening aligned with the pillar.

In accordance with one embodiment, a backside Vertical Cavity Surface Emitting Laser (VCSEL) array is disclosed. The VCSEL array has a substrate. A first mirror device is formed on the substrate. An active region is formed on the first mirror device. A second mirror device is formed on the active region. A plurality of pillars is formed by directional Inductive Coupled Plasma-Reactive Ion Etcher (ICP-RIE). Each pillar exposes a portion of the first mirror device, the active region and the second mirror device. A first metal contact is formed over a top section of each of the pillars. A second metal contact is formed on the substrate. A plurality of openings is formed in the second metal contact, wherein each opening is aligned with a corresponding pillar.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

Embodiments of the exemplary VCSEL and method of forming the same disclose a VCSEL having a pillar/mesa (hereinafter pillar) formed without the need of any oxide layer for narrowing the internal optical aperture definition and formation. Metal contacts at the top of Inductively Coupled Plasma (ICP)/Reactive Ion Etching (RIE) etched pillars do not need to form a hollow ring (i.e., an open circle in the middle) to emit the laser light from the center opening. This may eliminate the need of a metal contact ring for extended pillar size and allow the VCSEL array to be packed in the densest way, hence increasing the die count on a wafer and reducing the die cost accordingly.

Figure 1:
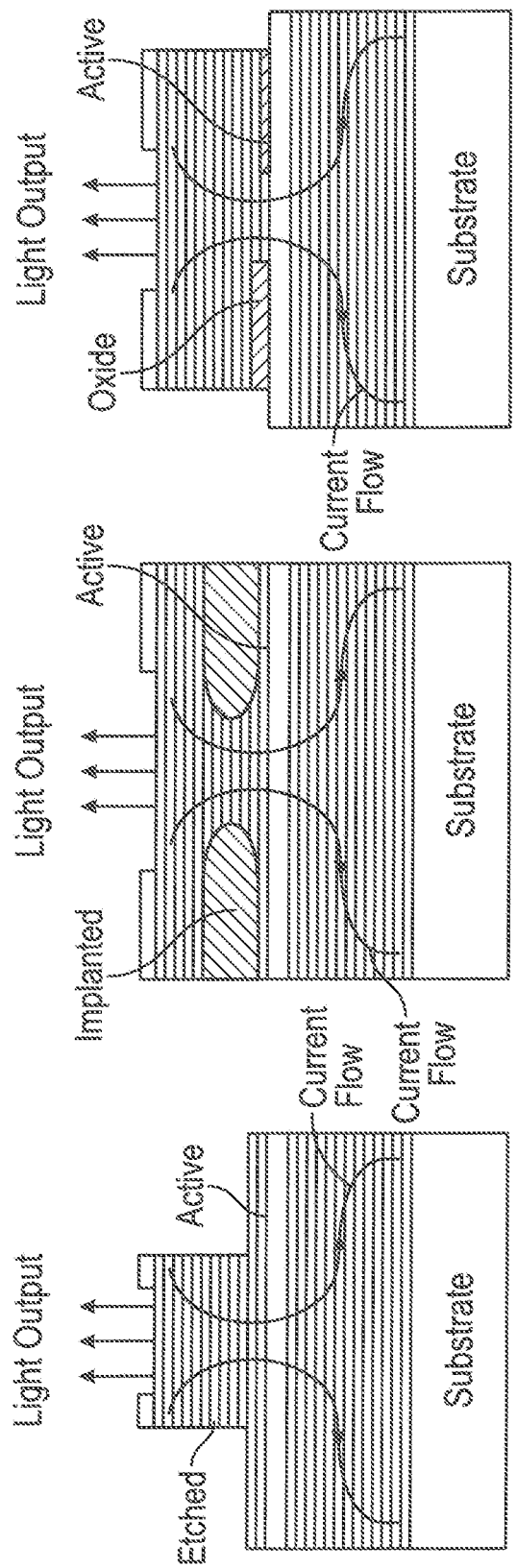
FIGS. 1A-IC show cross-sectional views of prior art VCSEL designs.

Referring to FIGS. 1A-IC, three prior art VCSEL designs may be seen. FIG. 1A depicts a VCSEL design having etched pillar (air post). VCSEL designs having etched pillars are generally used in larger VCSEL designs when the mesa or pillar size are in the 20-50 um in diameter and require no high frequency operation. A metal contact ring may be formed once the pillar is formed.

FIG. 1B depicts a VCSEL design using planar ion implant. VCSEL designs using planar ion implants are generally used in lower performance applications such as for optical mice due to the "not well defined" implant isolation edges.

FIG. 1C depicts a VCSEL design using etched mesa with AlGaAs oxidation. VCSEL designs using etched mesa with AlGaAs oxidation is more advanced than the previously mentioned methods and commonly used when speed (>1 Gbs) and power efficiency are important. Presently, the vast majority of the 3D sensing arrays are formed using VCSEL designs formed by using etched mesa with AlGaAs oxidation based with the mesa size in the 25-30 um range and an internal optical aperture size (defined by the AlGaAs oxidation fronts) of around 6-10 um. Metal contact rings may be formed once the mesa has been etched on the top side of the mesa where the laser light is emitting through.

Figure 2:
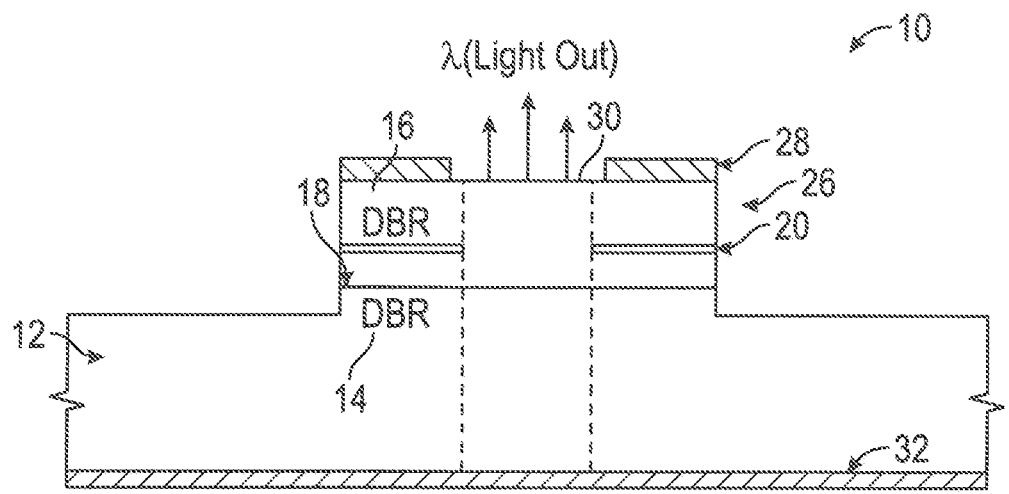
FIG. 2 shows a cross-sectional view of a prior art frontside VCSEL design.

Referring to FIG. 2, a cross-sectional view of a prior art frontside etched pillar VCSEL device 10. The VCSEL device 10 is formed on a substrate 12. The substrate 12 may be gallium arsenide (GaAs) substrate 12 or similar material. A pair of Distributed Braggs Reflectors (BDR) 14 and 16 may be formed on the substrate 12 and runs parallel to the substrate 12. The DBRs 14 and 16 may be formed of a plurality of layers. The DBRs 14 and 16 may be formed by disposing multiple layers of alternating materials with varying optical impedances. In general, the multiple alternate between high and low optical impedances.

An active region 18 may be formed between the pair of DBRs 14 and 16. The active region 18 may be formed of one or more quantum wells for laser light generation. A buried layer 20 may be formed between the active region 18 and the DBR 16. The buried region 20 may be selectively oxidized to form oxide apertures 22 and 24.

One or more pillars 26 may then be formed by etching through the DBR 16 down to the active region 18 and to the DBR 14. Reactive ion etching may be used to form the free-standing pillars 26 that confine both the light and electrical current in the lateral direction. However, this type of device suffers increasing optical loss due to optical scattering at the surfaces of the pillar 26 as the pillar 26 diameter is reduced. A top metal contact ring 28 may then be formed on the top of the pillar 26. The metal contact ring 28 will need to have a center open 30 to emit light therethrough. A bottom metal contact layer 32 may be formed on the substrate 12.

Figure 3:
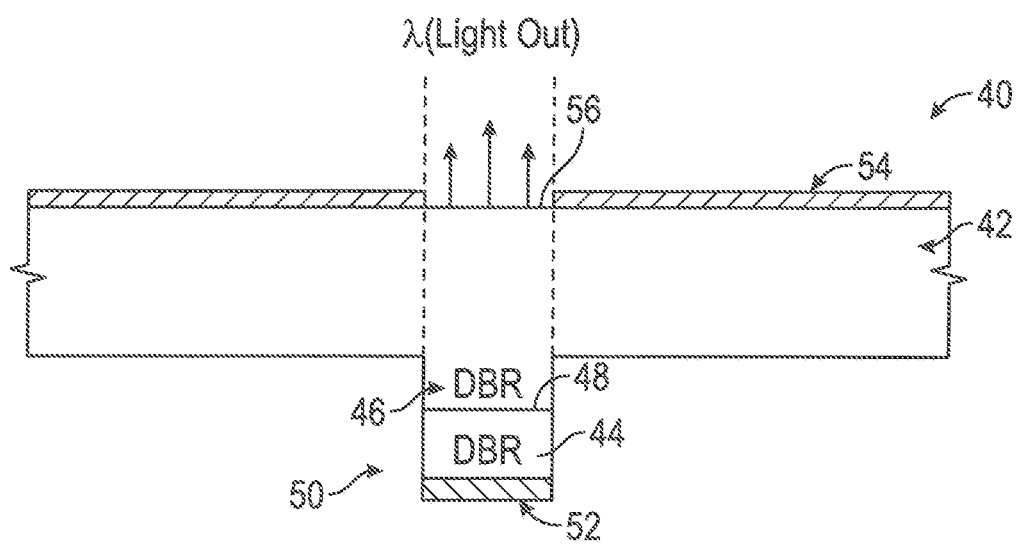
FIG. 3 shows a cross-sectional view of an exemplary embodiment of a pillar confined backside illuminating VCSEL in accordance with one aspect of the present application.

Referring to FIG. 3, a cross-sectional view of an exemplary embodiment of a pillar confined backside emitting VCSEL 40 (hereinafter VCSEL 40) may be seen. The VCSEL 40 may have multiple advantages over the prior art designs namely: (1) flip-chip configurable, (2) improved thermal arrangement, (3) denser array for the same power output, (4) one step reflow assembly and packaging process, (5) lithographically based lens formation at the backside of the substrate opening, (6) lower pillar or mesa height, and (6) dielectric DBR feasible to replace one epi-based DBR for more design flexibility and lower cost.

The VCSEL device 40 is formed on a substrate 42. The substrate 42 may be gallium arsenide (GaAs) substrate 42 or similar material. A pair of Distributed Braggs Reflectors (DBR) 44 and 46 may be formed on the substrate 42 and runs parallel to the substrate 42. The DBRs 44 and 46 may be formed of a plurality of layers. The DBRs 44 and 46 may be formed by disposing multiple layers of alternating materials with varying optical impedances. In general, the multiple alternate between high and low optical impedances.

An active region 48 may be formed between the pair of DBRs 44 and 46. The active region 48 may be formed of one or more quantum wells for laser light generation.

One or more pillars 50 may then be formed. In the present embodiment, a highly directional ICP (Inductive Coupled Plasma) reactive ion etcher (RIE) may be used to etch highly anisotropic pillars 50. By using ICP-RIE, the pillars 50 may have a cylinder type of cross-sectional profile having close to straight side walls. In accordance with one embodiment, the pillars 50 may have a profile in the 5-50 um diameter range. Etching by using ICP-RIE is important since if wet chemical isotropic etchant is used, the side walls of the pillars 50 will be tapered which will present issues when small diameter VCSELs are to be fabricated. Thus, the pillars 50 should be etched by ICP-RIE with an anisotropic straight wall profile.

A top metal contact 52 may then be deposited and cover the top of the pillar 50. The metal contact 52 does not have to be in a ring configuration to emit light therethrough. In accordance with one embodiment, the top metal contact 52 may be use as the pillar ICP-RIE etch mask so there will be no need to deposit the top metal contact after the ICP-RIE pillar etch is performed. This will greatly simplify the manufacturing process of the VCSEL array with the current invention.

After the top metal contact 52 and pillars 50 are formed, the wafer upon which the VCSEL device 40 is formed upon may be turned around to form a backside metal contact 54. The backside metal contact 54 may be formed with an opening 56 to allow the laser light to be emitted from the back of the VCSEL device 40. The opening 56 may be aligned with the pillar 50 to allow the laser light to be emitted from the back of the VCSEL device 40.

Figure 4:
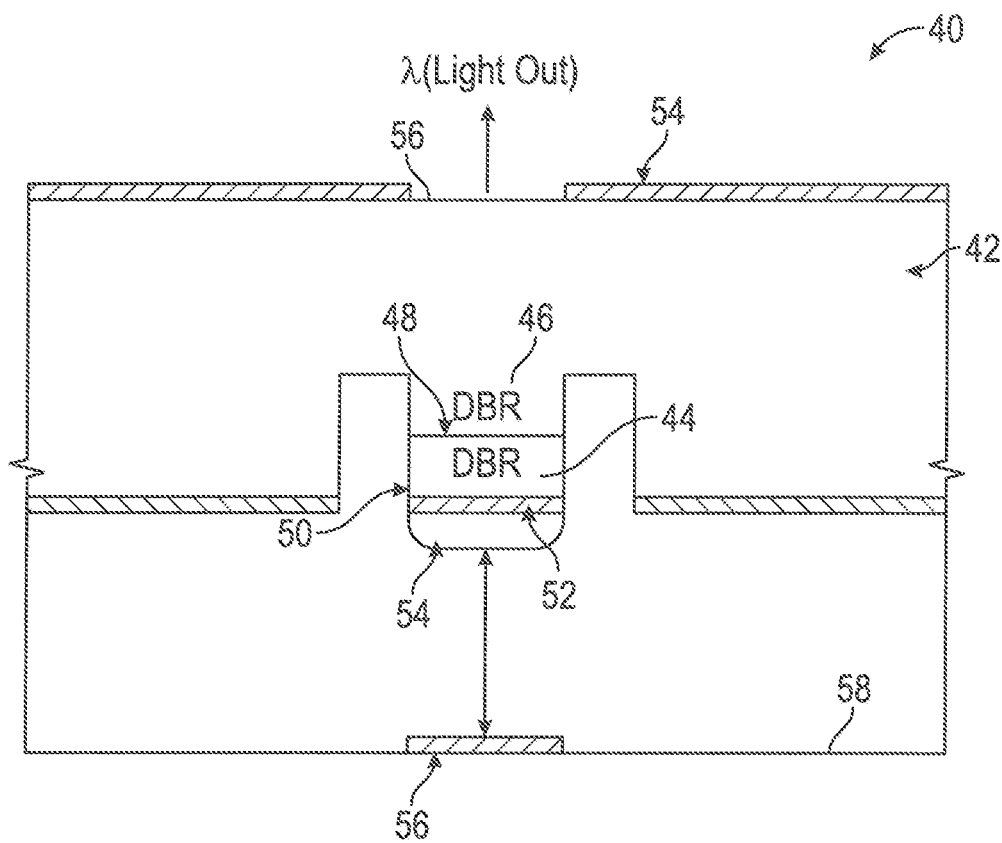
FIG. 4 is a cross-sectional view of an exemplary embodiment of the VCSEL of FIG. 3 in a flip-chip configuration in accordance with one aspect of the present application.

Referring to FIG. 4, since the VCSEL device 40 is intended for the laser light to emit through the backside of the substrate 42, a flip-chip configuration may be required. The VCSEL device 40 may be formed on a substrate 42. A pair of Distributed Braggs Reflectors (DBR) 44 and 46 may be formed on the substrate 42 and runs parallel to the substrate 42. An active region 48 may be formed between the pair of DBRs 44 and 46. The active region 48 may be formed of one or more quantum wells for laser light generation. One or more pillars 50 may then be formed. In the present embodiment, a highly directional ICP (Inductive Coupled Plasma) reactive ion etcher (RIE) may be used to etch highly anisotropic pillars 50. By using ICP-RIE, the pillars 50 may have a cylinder type of cross-sectional profile having close to straight side walls. In accordance with one embodiment, the pillars 50 may have a profile in the 5-50 urn diameter range. A top metal contact 52 may be used as the ICP-RIE etch mask or if not then be deposited and cover the top of the pillar 50 after the pillar is formed. After the top metal contact 52 is deposited, the wafer upon which the VCSEL device 40 is formed upon may be turned around to form a backside metal contact 54. The backside metal contact 54 may be formed with an opening 56 to allow the laser light to be emitted from the back of the VCSEL device 40.

To flip-chip mount the VCSEL device 40, solder tips may be placed on the metal contact 52 formed on the pillars 50. In accordance with one embodiment, the solder tips may be done by electric-chemical plating a thin layer of solder 54 such as Au—Sn on top of the metal contact 42 of the pillar 50. The wafer upon which the VCSEL device 40 is formed upon may be turned upside down so that the solder 54 meets and join metal pad 56 of a package or heat sinking substrate 58. In accordance with one embodiment, the solder 54 meets and joins the metal pad 56 through a furnace-based solder re-flow process.

The VCSEL device 40 allows for additional design features such as lithographically formed focusing or diffraction or structure lens to be placed on the backside of the wafer where the backside metal opening is that emits the laser light. This feature will provide the VCSEL users to align, direct, focus, and adjust the laser lights coming out of the pillars 50 with different lens designs.

Figure 5:
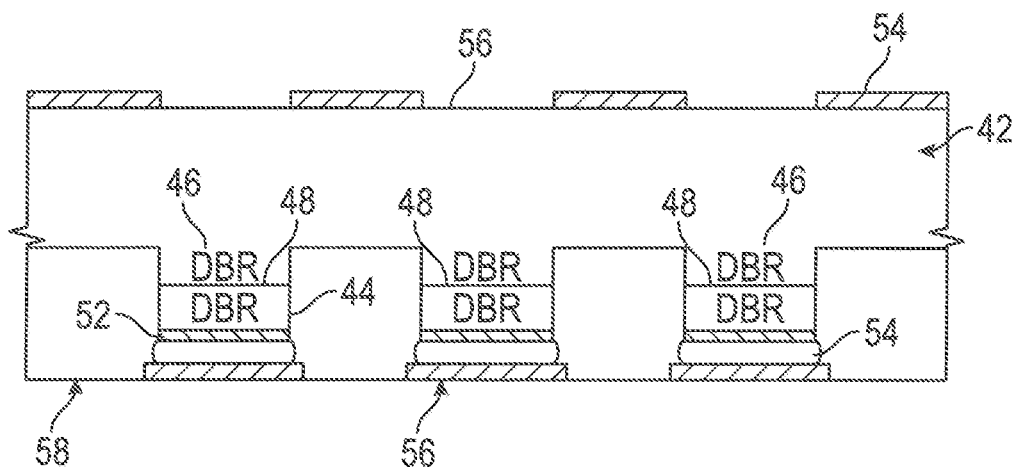
FIG. 5 is a cross-sectional view of an exemplary embodiment of the VCSEL of FIG. 3 in a flip-chip configuration for array applications in accordance with one aspect of the present application.

Referring to FIG. 5, an array 70 of VCSEL devices 40 which may be formed on a single wafer may be seen. Each of the VCSEL devices 40 may be formed on a substrate 42. A pair of Distributed Braggs Reflectors (DBR) 44 and 46 may be formed on the substrate 42 and runs parallel to the substrate 42 for each VCSEL device 40. An active region 48 may be formed between the pair of DBRs 44 and 46 of each VCSEL device 40. The active region 48 may be formed of one or more quantum wells for laser light generation. One or more pillars 50 may then be formed for each VCSEL device 40. In the present embodiment, a highly directional ICP (Inductive Coupled Plasma) reactive ion etcher (RIE) may be used to etch highly anisotropic pillars 50. By using ICP-RIE, the pillars 50 may have a cylinder type of cross-sectional profile having close to straight side walls. In accordance with one embodiment, the pillars 50 may have a profile in the 5-50 urn diameter range. A top metal contact 52 may then be deposited and cover the top of each pillar 50.

After the top metal contact 52 is formed, the wafer upon which the array 70 of VCSEL devices 40 is formed upon may be turned around to form a backside metal contact 54 for each VCSEL device 40. The backside metal contact 54 may be formed with openings 56 to allow the laser light to be emitted from the back of each of the VCSEL devices 40.

To flip-chip mount the array 70 of VCSEL devices 40, solder tip may be placed on the metal contact 52 formed on each pillar 50. In accordance with one embodiment, the solder tips may be done by electric-chemical plating a thin layer of solder 54 such as Au—Sn on top of the metal contact 42 of the pillar 50. The wafer upon which the VCSEL device 40 is formed upon may be turned upside down so that the solder 54 meets and join metal pad 56 of a package or heat sinking substrate 58. In accordance with one embodiment, the solder 54 meets and joins the metal pad 56 through a furnace-based solder re-flow process.

It is necessary that the solder 54 be placed on the metal contact 52 formed on each pillar 50 to ensure good thermal contact of every VCSEL device 40, and to avoid any air voids. Air voids formed underneath a large area array may cause uneven thermal contact and create localized heated spots.

Figure 6A:
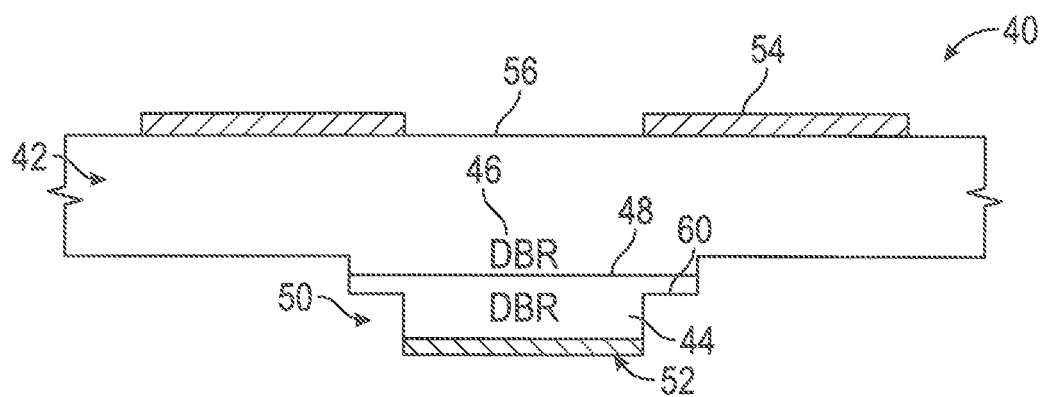
FIG. 6A shows a cross-sectional view of an exemplary embodiment of a pillar confined backside illuminating VCSEL with the pillar having a ledge in accordance with one aspect of the present application.

Referring to FIG. 6A, in the VCSEL device 40, the pillar 50 may be formed to have a shallow ledge or shallow pillar design 60 (hereinafter ledge 60). The ledge 60 may be formed since one does not need to etch the pillar 60 like in the prior art shown in FIG. 2 and go deep down to go through the DBR layers 14 and 16 and expose the optional AlGaAs oxide layer 20 which is close to the active region 18. Thus, only a shallow pillar 50 may be formed to provide a directional path to drive the current through the active region 48. This will make the overall array structure more planar and mechanically stable in subsequent photo and assembly processes. The pillar 50 may be formed so as to not penetrate the DBR 46 but stop at or before the active region 48. In accordance with one embodiment, the pillar 50 may have a depth which is less than approximately 50% to 75% of the DBR layers thickness.

In typical prior art VCSEL designs, there are two thick DBR layers, each of 3-5 micron in thickness, sandwiched the active region (i.e., Quantum Well (QW) action region). In the prior art designs, the AlGaAs oxidation layer which is close to the active region must be exposed by the pillar etch so subsequent oxidation process can be performed. Since the AlGaAs oxidation layer is in between the two DBR layers, the pillar must be formed deep enough to penetrate through one side of DBR layers to expose the AlGaAs oxidation layer. However, in the current invention since no dedicated oxidation layer is required to define the optical aperture, a shallow pillar etch may be adequate and applicable.

Figure 6B:
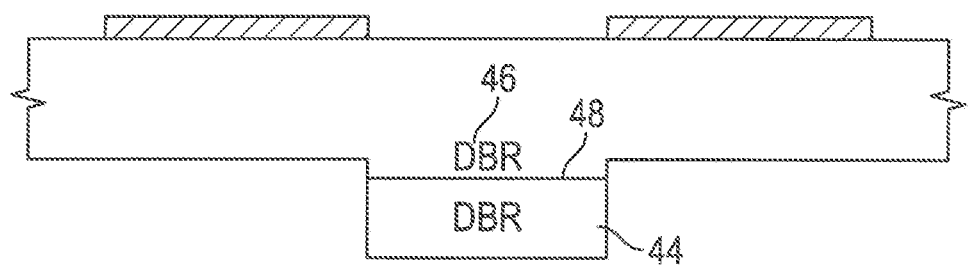
FIG. 6B shows a cross-sectional view of an exemplary embodiment of a pillar confined backside illuminating VCSEL with a PECVD formed DBR in accordance with one aspect of the present application.

Referring to FIG. 6B, in the VCSEL device 40, the DBR 44 may be deposited by PECVD instead of an epi based DBR layers, which is expensive and irrevocable in the epi growth process. The dielectric DBR 44 is easy to deposit and can be re-worked and re-deposited if required. This makes the present embodiment attractive in offering additional design and performance flexibility, and at the same time reduce the overall epi wafer cost because only the bottom side of the epi based DBR layers is required. This may reduce the MOCVD growth time of the VCSEL by approximately 50% as the DBR layers' growth is the most time-consuming part of the epi process.

Figure 7:
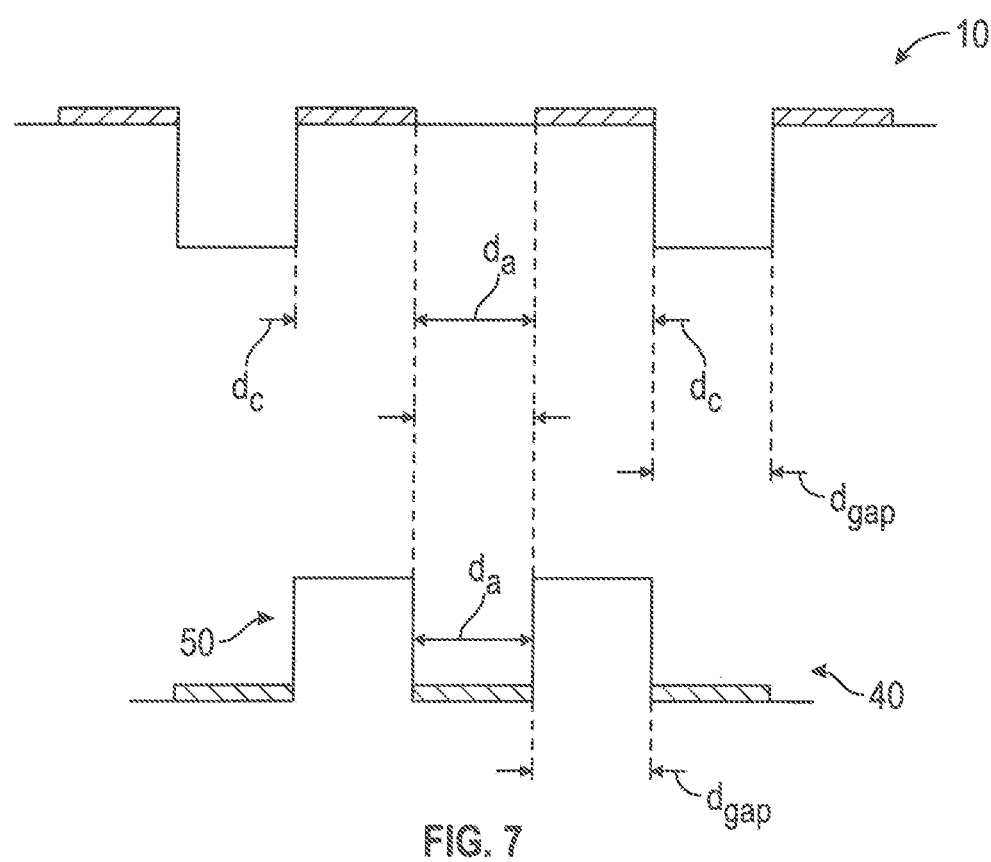
FIG. 7 shows a comparison of cross-sectional views of a prior art VCSEL and an exemplary embodiment of a pillar confined backside illuminating VCSEL to show spacing between adjacent VCSEL devices in accordance with one aspect of the present application.

The VCSEL device and method of manufacturing eliminates the need for dedicated internal oxide aperture as well as the front side contact metal opening thus the size of the VCSEL pillar 50 can be reduced as shown in FIG. 7 where the aperture size is denoted as "da", the length of the top contact metal ring or the oxidation depth (whichever is longer) is denoted as "dc", and the minimum distance between two pillars 50 is denoted as "dgap". From FIG. 7, the minimum overall distance of the unit cell (the period of each repeating VCSEL) for an array of VCSELs 10 is equal to "da+2dc+dgap", while the minimum overall distance of the unit cell (the period of each repeating VCSEL) for an array of VCSELs 40 is equal to "da+dgap".

In practice "da" may typically be around 5-10 um, the same range for "dc" and "dgap", so for simplicity purpose let's assume all three distances da, dc, and dgap are 10 um in length. Thus, the unit cell of one-dimensional distance is 40 um for the prior art, and only 20 um under the current design. Since 3D sensing VCSEL array is typically 2D array in nature, the die size and density advantage of the current design will be $(20/40) \times (20/40) = 0.25$, meaning a minimum of 4× increase of the total die counts in the same wafer area with the current invention. The die size and die count advantage will greatly decrease the die cost without compromising or giving up any performance spec. This is in fact in addition to the advantage of assembly and packaging simplification and better thermal arrangement with the Flip-chip configuration when the solder tip is place at each and every VCSEL pillar.

The VCSEL design of the current invention has offered multiple advantages over the prior art designs namely; (1) flip-chip configurable, (2) better thermal arrangement, (3) denser array for the same power output, (4) one step reflow assembly and packaging process, (5) lithographically based lens formation at the backside opening, (6) lower pillar or mesa height, and (6) dielectric DBR feasible to replace one epi-based DBR for more design flexibility and lower cost.

While embodiments of the disclosure have been described in terms of various specific embodiments, those skilled in the art will recognize that the embodiments of the disclosure may be practiced with modifications within the spirit and scope of the claims.

What is claimed is:

1. A backside Vertical Cavity Surface Emitting Laser (VCSEL) comprising:
    a substrate;
    a first mirror device formed on the substrate;
    an active layer applied directly on the first mirror device generating light;
    a second mirror device directly attached to the active layer and having a thickness of 3-5 um;
    a ledge formed only in the second mirror device by directional Inductive Coupled Plasma-Reactive Ion Etcher (ICP-RIE) forming a pillar having a depth between 50% and 75% of the thickness of the second mirror device, the pillar has a diameter between 5-50 um, wherein the second mirror device is directly attached to the active layer across an entire width of each pillar;
    a first metal contact formed over a top section of the pillar;
    a second metal contact formed on the substrate; and
    an opening formed in the second metal contact and aligned with the pillar.

2. The backside Vertical Cavity Surface Emitting Laser (VCSEL) of claim 1, comprising a device flip-chip mounted to the backside VCSEL.

3. The backside Vertical Cavity Surface Emitting Laser (VCSEL) of claim 1, comprising:
    a solder formed on the first metal contact;
    wherein the solder attaches to a metal contact of a device to flip-chip mount the device to the backside VCSEL.

4. The backside Vertical Cavity Surface Emitting Laser (VCSEL) of claim 1, wherein the first mirror device is a first Distributed Braggs Reflector.

5. The backside Vertical Cavity Surface Emitting Laser (VCSEL) of claim 4, wherein the second mirror device is a second Distributed Braggs Reflector.

6. The backside Vertical Cavity Surface Emitting Laser (VCSEL) of claim 1, wherein the active region is a quantum well.

7. A backside Vertical Cavity Surface Emitting Laser (VCSEL) array comprising:
    a substrate;
    a first mirror device formed on the substrate;
    an active layer applied directly on the first mirror device generating light;
    a second mirror device directly attached to the active layer and having a thickness of 3-5 um;
    a plurality of pillars formed by directional Inductive Coupled Plasma-Reactive Ion Etcher (ICP-RIE), wherein the second mirror device is directly attached to the active layer across an entire width of each pillar, each pillar exposing only a portion of the first mirror device, each pillar having a depth between 50% and 75% of the thickness of the second mirror device, each pillar having a diameter between 5-50 um;
    a first metal contact formed over a top section of each of the pillars;
    a second metal contact formed on the substrate; and
    a plurality of openings formed in the second metal contact, wherein each opening is aligned with a corresponding pillar.

8. The backside Vertical Cavity Surface Emitting Laser (VCSEL) array claim 7, comprising a device flip-chip mounted to the backside VCSEL array.

9. The backside Vertical Cavity Surface Emitting Laser (VCSEL) array of claim 7, comprising:
    solder formed on the first metal contacts;
    wherein the solder attaches to metal contacts of a device to flip-chip mount the device to the backside VCSEL array.

10. The backside Vertical Cavity Surface Emitting Laser (VCSEL) array of claim 7, wherein the first mirror device and the second mirror device are Distributed Braggs Reflectors.

11. The backside Vertical Cavity Surface Emitting Laser (VCSEL) array claim 7, wherein the first mirror device is a Distributed Braggs Reflector.

12. The backside Vertical Cavity Surface Emitting Laser (VCSEL) array claim 7, wherein the second mirror device is a Distributed Braggs Reflector.

13. The backside Vertical Cavity Surface Emitting Laser (VCSEL) array claim 7, wherein the active region is a quantum well.

14. A backside Vertical Cavity Surface Emitting Laser (VCSEL) comprising: a substrate; a first mirror device formed on the substrate; an active layer applied directly on the first mirror device generating light; a second mirror device directly attached to the active layer; a ledge formed only in the second mirror device by directional Inductive Coupled Plasma-Reactive Ion Etcher (ICP-RIE) forming a pillar, the pillar has a diameter between 5-50 um, wherein the second mirror device is directly attached to the active layer across an entire width of each pillar; a first metal contact formed over a top section of the pillar; a second metal contact formed on the substrate; and an opening formed in the second metal contact and aligned with the pillar.

\* \* \* \* \*